United States Patent
Diehm et al.

(10) Patent No.: US 6,726,087 B2
(45) Date of Patent: Apr. 27, 2004

(54) PROCESS AND DEVICE FOR SOLDERING ELECTRICAL COMPONENTS ON A PLASTIC SHEET

(75) Inventors: Rolf Ludwig Diehm, Wertheim (DE); Volker Liedke, Leimersheim (DE)

(73) Assignee: Seho Systemtechnik GmbH, Kreuzwertheim (DE)

( * ) Notice: Subject to any disclaimer, the term of this patent is extended or adjusted under 35 U.S.C. 154(b) by 0 days.

(21) Appl. No.: 10/190,618

(22) Filed: Jul. 9, 2002

(65) Prior Publication Data
US 2003/0024966 A1 Feb. 6, 2003

(30) Foreign Application Priority Data
Jul. 9, 2001 (DE) .......................... 101 33 217

(51) Int. Cl.⁷ .............................. B23K 31/02
(52) U.S. Cl. ..................... 228/229; 228/232; 228/234.1
(58) Field of Search .................. 228/179.1, 180.1, 228/180.21, 180.22, 227, 229, 230, 232, 234.1

(56) References Cited

U.S. PATENT DOCUMENTS

| | | | |
|---|---|---|---|
| 3,617,682 A | * | 11/1971 | Hall ..................... 219/85.18 |
| 3,742,181 A | * | 6/1973 | Costello ................. 219/85.12 |
| 4,184,623 A | * | 1/1980 | Strasser ................. 228/180.21 |
| 4,610,388 A | | 9/1986 | Koltuniak et al. |
| 4,927,068 A | | 5/1990 | Naka et al. |
| 4,979,664 A | * | 12/1990 | Lyons et al. ............. 228/180.21 |
| 5,196,667 A | | 3/1993 | Gammelin |
| 5,433,368 A | | 7/1995 | Spigarelli |
| 5,639,011 A | * | 6/1997 | Jacks et al. ............. 228/180.21 |
| 6,005,224 A | | 12/1999 | Wesseling et al. |
| 6,145,734 A | | 11/2000 | Taniguchi et al. |
| 6,162,660 A | * | 12/2000 | LaFontaine et al. ........ 438/108 |
| 6,257,866 B1 | * | 7/2001 | Fritz et al. .............. 425/387.1 |
| 6,402,011 B1 | * | 6/2002 | Taniguchi et al. ......... 228/180.1 |
| 6,443,355 B1 | * | 9/2002 | Tsurusaki ................ 228/222 |
| 6,600,137 B1 | * | 7/2003 | Nonomura et al. ......... 219/388 |
| 2002/0053588 A1 | * | 5/2002 | Taniguchi et al. |
| 2003/0024966 A1 | * | 2/2003 | Diehm et al. |
| 2003/0102297 A1 | * | 6/2003 | Goenka et al. |

FOREIGN PATENT DOCUMENTS

| | | |
|---|---|---|
| DE | 195 27 398 | 1/1997 |
| WO | WO 94/21415 | 9/1994 |

OTHER PUBLICATIONS

Patent Abstract of Japan, E–1277, Oct. 9, 1992, vol. 16, No. 488, JP 4–179294 A, Jun. 25, 1992,.

* cited by examiner

Primary Examiner—Kiley Stoner
(74) Attorney, Agent, or Firm—Banner & Witcoff, Ltd.

(57) ABSTRACT

The invention relates to a process for soldering electrical components to soldering positions, which are provided with soldering material, on a plastic sheet provided with applied conductor tracks. The plastic sheet is heated, from the side which is remote from the components, to a below its damage temperature and after heating its side which is remote from the components is thermally insulated. Then, the side which faces the components is acted on by a heating-gas stream which is concentrated onto the locations which are to be soldered by a template which has windows.

5 Claims, 3 Drawing Sheets

PROCESS AND DEVICE FOR SOLDERING ELECTRICAL COMPONENTS ON A PLASTIC SHEET

The invention relates to a process and a device for soldering electrical components at soldering locations, which are provided with soldering material, on a plastic sheet provided with applied conductor tracks.

Plastic sheets with applied conductor tracks and electrical components soldered thereto can advantageously be used if electrical lines are laid in a manner in which the corresponding substrate must have a certain flexibility.

For these reasons, plastic sheets have already been used as substrates for conductor tracks and electrical components which must have a suitable thermal stability on account of the temperatures required during soldering of the electrical components, which are approximately 210° C. Plastics of this type are expensive. In this context, hitherto polyamide (PI) has been used as the basic plastic. Because of the costs associated with this plastic, a plastic sheet produced therefrom is in many technologies unsuitable as a substrate for conductor tracks. This applies in particular in the automotive industry, in which conductor bundles have to be positioned at numerous locations within a motor vehicle, the corresponding substrates being exposed to considerable loads when the conductor tracks are being fitted into a motor vehicle during production.

The attempt to use less expensive plastics as substrates for conductor tracks has hitherto failed because technically suitable and sufficiently inexpensive plastics do not withstand the temperatures which occur during soldering. The basic object is to configure the process outlined in the introduction in such a way that it is suitable for known, relatively inexpensive plastics, such as polyester derivatives (PEN, FEPT), without these plastics being impaired in any way during soldering.

According to the invention, this is achieved by the fact that the plastic sheet is heated, from the side which is remote from the components, to a below its damage temperature and after heating its side which is remote from the components is thermally insulated, and then the side which faces the components is acted on by a heating-gas stream which is concentrated onto the locations which are to be soldered by a template which has windows.

The result of this process is that the supply of heat to the plastic sheet is limited to a minimum and only reaches a relatively high level, allowing melting of the solder, where soldering material is already present. This is achieved by the fact that, first of all, as a result of the plastic sheet being heated to a level which is just below its damage temperature, the total energy which is to be supplied to the plastic sheet is considerably limited. Also, on account of the heating of the plastic sheet and on account of its low thermal conductivity and, owing to the temperature difference between plastic sheet and melting point of the solder, only relatively little heat with minimal energy is sufficient. The greater heat which is then to be applied at the soldering locations and is generated by the heating-gas stream can be concentrated to such an extent by the template which has windows that only the locations which are to be soldered are exposed to a high incoming heat flux, with the result that the surrounding regions of the plastic sheet are exposed to scarcely any additional heating, and therefore there can be no damage to the plastic sheet as a result of considerable heating. In order in the process to prevent heat from flowing out of the heated plastic sheet, which would lead to additional, undesirable demand for heat by the plastic sheet, after the plastic sheet has been heated its side which is remote from the components is thermally insulated. As long as this thermal insulation exists, therefore, the plastic sheet retains its temperature which has been produced by heating.

It should also be noted that in International Patent Application WO 94/21415, in connection with reflow soldering of printed circuit board assemblies, the heating of the soldering locations takes place by radiation in a heating chamber. To exclude selected regions in the heating chamber from the radiation, in this document a mask substrate is proposed, which can be displaced out of a position outside the heating chamber into the heating chamber and can be lowered onto the printed circuit board assembly, with the result that the selected region is shadowed from the radiation for a predetermined time. This soldering method is not suitable for plastic sheets, on account of the high introduction of heat which occurs therein, since the polyester derivatives which can be used by the invention would immediately be melted in the heating chamber which is heated by the radiation.

To concentrate the heat supply operation as much as possible and therefore to make it as short as possible, the heating of the plastic sheet and the application of heat to that side of the plastic sheet which faces the components are expediently configured in such a way that this takes place substantially simultaneously.

To carry out the soldering operation, in practice the temperature of the heating-gas stream, with the plastic sheet held securely, is regulated in such a manner that initially the soldering locations are preheated for a time which activates the soldering material, whereupon the temperature of the heating-gas stream is briefly increased until the solder contained in the soldering material melts, and is then rapidly reduced. This procedure ensures that only a minimal time is required for the actual soldering, which takes place during melting of the solder contained in the soldering material, since before the soldering material is melted, the preheating of the soldering locations takes place for a time which activates the soldering material, so that, therefore, only a very short burst of temperature is required in order to melt the solder, with the result that the plastic sheet is reliably protected against excessive heating.

Reducing the temperature of the heating-gas stream after soldering is expediently effected by the heating-gas stream being switched off after the melting. Furthermore, it is also possible to convert the heating-gas stream into a cooling stream, in order to ensure particularly rapidly that no damaging heat whatsoever can remain in the region of the plastic sheet.

A device for carrying out the process described above is expediently configured in such a way that it has a heating blower, in front of which the plastic sheet together with the components held thereon can be positioned, and a heating plate for preheating the plastic sheet a template is arranged in such a manner that it can be pushed in on that side of the plastic sheet which is remote from the heating-gas blower, and the heating plane is arranged displaceably with regard to its distance from the plastic sheet. When the abovementioned thermal insulation of the plastic sheet is then to take place, this expediently occurs by increasing the distance between the heating plate and the plastic sheet, resulting in a larger gas-filled space which acts as insulation. In order for the energy also to be concentrated with regard to the locations to be acted on on the part of the heating blower, the heating-gas blower in expediently provided with positionable outlets, with the result that it is possible to achieve any desired flow concentration at selected locations, and in particular, of course, at the locations which are to be soldered. For the template, it is advantageously possible to use an areal material which has a low thermal conductivity. In this case, the template can easily be pressed onto the plastic sheet and hold the latter in place during the soldering process. However, it is also possible for the template to be formed from a metal sheet which in this case, on account of the high thermal conductivity of metal, is to be held at a distance from this plastic sheet. Furthermore, it is possible for the template to be provided with an interior for accomodating a cooling medium. In this way, it is possible to ensure, by means of the cooled template, that those regions of the plastic sheet which are covered by the template are additionally provided with particular protection on account of the low temperature thereof.

Exemplary embodiments of the invention are illustrated in the figures, in which.

Figure 12:
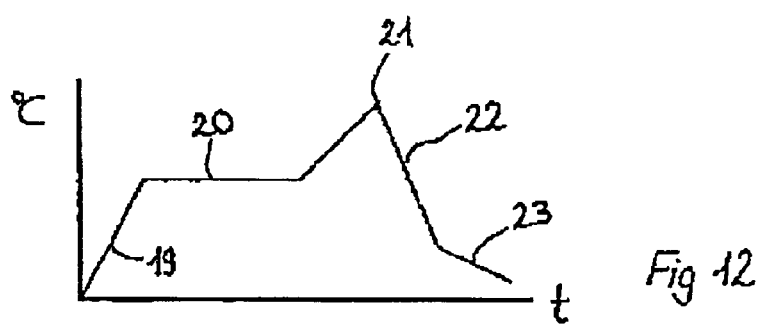
Figure 11:
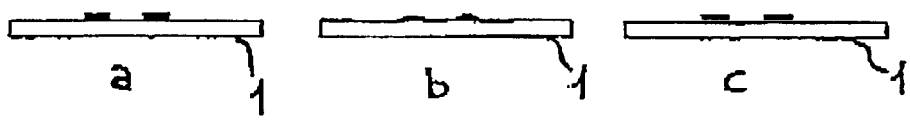

FIGS. 11a,b,c show solder material applied in different ways;

FIG. 12 shows a time curve for soldering by means of solder paste.

Figure 1:
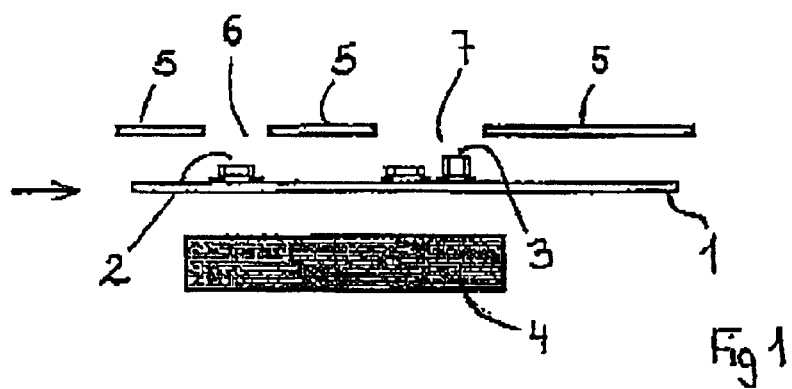
FIG. 1 shows the positioning of the items which are to be soldered (plastic sheet with applied conductor tracks and electrical components) positioned in the device.
Figure 10:
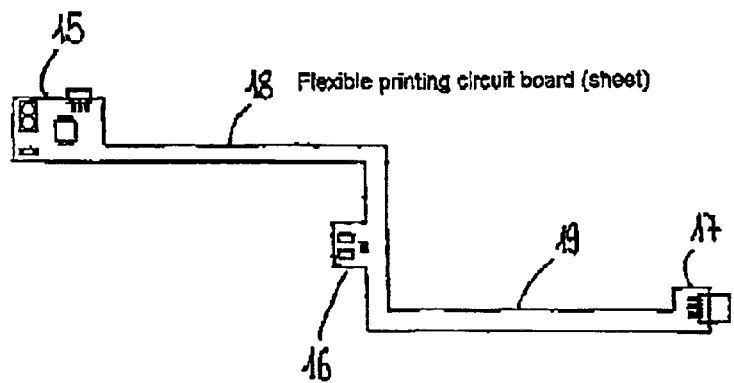
FIG. 10 shows an exemplary embodiment for items which are to be soldered and are in the form of a flexible printed circuit board.

FIG. 1 shows an outline view of the components which are required to carry out the process, specifically the plastic sheet 1 with applied electrical components 2, 3 (individual components and integrated circuits), which are connected on the relevant surface of the plastic sheet 1 by conductor tracks, which are not visible in FIG. 1 (cf FIG. 10). The heating plate 4, which is used to heat the plastic sheet 1, is arranged below the plastic sheet, and above the plastic sheet 1 is the template 5 which can be moved in and out and into which windows 6 and 7 are cut, with the result that a supply of heat, which is explained in more detail below, is limited to the area of these windows. FIG. 1 shows the device in the state in which the items to be soldered are being positioned; initially for reasons of space, the heating plate 4 and the template 5 maintain a certain distance from the items which are to be soldered.

Figure 2:
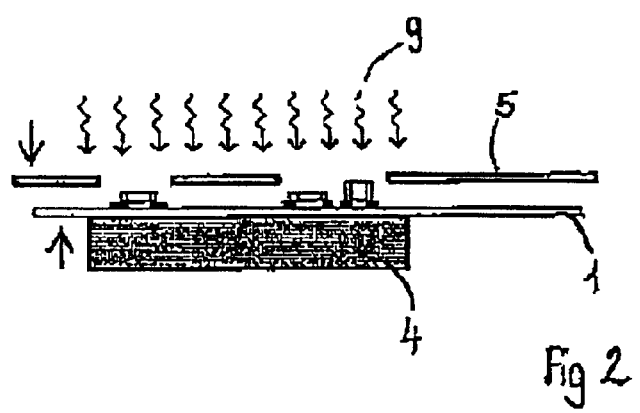
FIG. 2 shows the preheating of the items which are to be soldered.

FIG. 2 illustrates the process step involved in heating the plastic sheet 1 by means of the heating plate 4, which has been moved onto the plastic sheet 1 in the direction indicated by the arrow illustrated next to the heating plate 4, specifically onto the side which is remote from the electrical components. Next, by means of the heating plate 4 which bears against the plastic sheet 1 and if appropriate may also be held at a short distance from the plastic sheet, the plastic sheet 1 is heated, with the result that, as mentioned above, the further demand for heat for soldering of the electrical components is correspondingly reduced. During this heating operation, heat is already being supplied to that side of the plastic sheet 1 which bears the electrical components, by the heating-gas stream 9. However, it should be noted that the supply of the heating-gas stream can take place not only while the plastic sheet is being heated but also after the heating of the plastic sheet has commenced.

Figure 3:
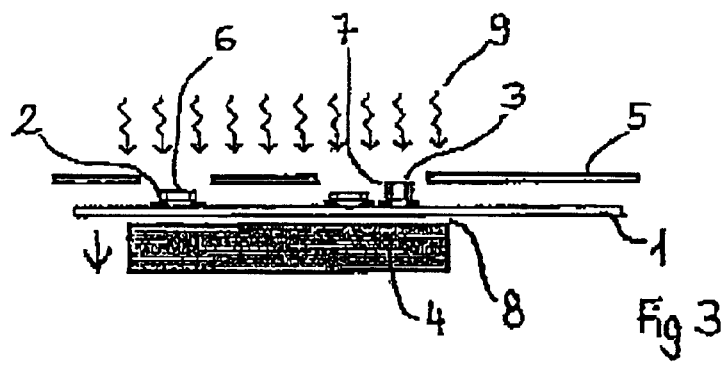
FIG. 3 shows the soldering using heating gas.

FIG. 3 shows the device in the state during the process step of soldering by means of the heating-gas stream 9; to avoid excess heat being supplied to the plastic sheet 1, the heating plate 4 has been lowered slightly compared to the position shown in FIG. 2, thus producing a small space 8 between plastic sheet 1 and heating plate 4, which acts as thermal insulation, so that on the one hand heat can no longer be transmitted from the heating plate 4 to the plastic sheet 1, but on the other hand the sheet does not loose its temperature. The heating-gas stream 9 which acts on the electrical components 2 and 3 through the windows 6 and 7 in the template 5 is channeled through the windows 2 and 3 and concentrated on the electrical components 2 and 3, so that excessive heating of the plastic sheet 1 is avoided.

Figure 4:
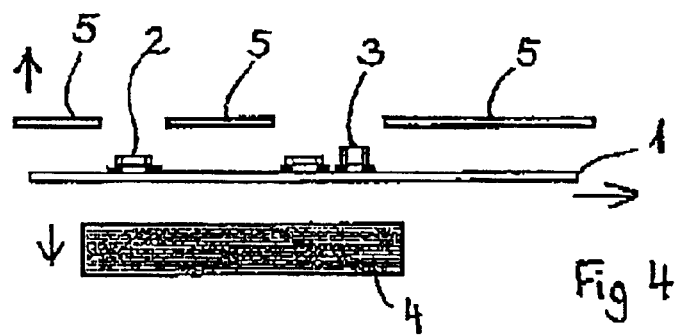
FIG. 4 shows the removal of the soldered items from the device.

FIG. 4 illustrates the device in the position in which the plastic sheet 1, together with the electrical components 2 and 3 which have been soldered to it and the conductor tracks which connect them is removed in soldered form from the device (cf. arrow at the plastic sheet 1), the template 5 and the heating plate 4 having previously been moved away from the plastic sheet 1.

Figure 5:
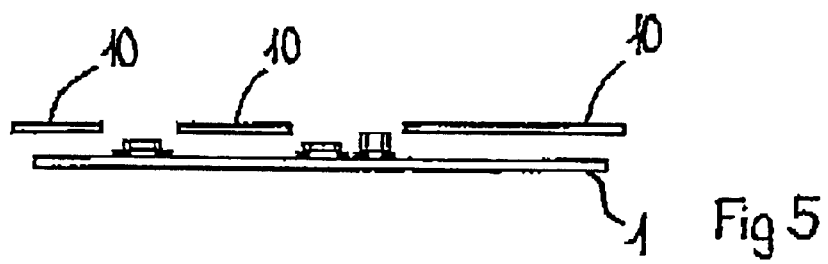
FIG. 5 shows the arrangement of a metal template with respect to the items which are to be soldered.
Figure 6:
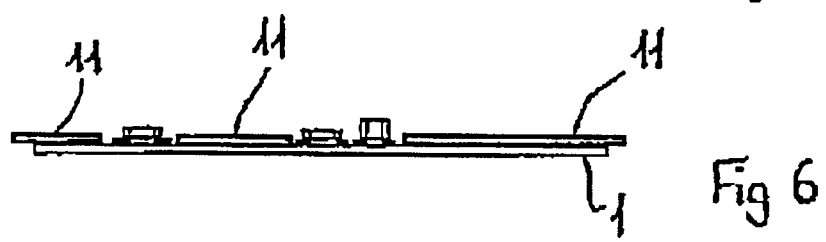
FIG. 6 shows the arrangement of a template made from material with a low thermal conductivity.

As has already been mentioned above, various materials can be used for the templates. FIG. 5 diagrammatically depicts the use of a metal template 10 which, during soldering, is held at a distance from the plastic sheet 1. In the illustration shown in FIG. 6, this is a template of low thermal conductivity, i.e. if appropriate a heat-resistant plastic which is placed onto the plastic sheet 1 during soldering.

Figure 7:
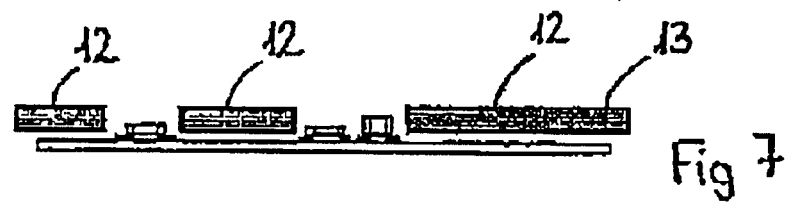
FIG. 7 shows the arrangement of a template with internal cooling with respect to the items which are to be soldered.

FIG. 7 shows the use of a template 12 with internal cooling. This is a template with a cavity 13 through which a cooling medium flows. With this template, it is possible to bring about rapid cooling of the plastic sheet together with the soldered electrical components, which may be desirable and is advantageous because rapid cooling of the plastic sheet after soldering protects the sheet from damage particularly successfully.

Figure 8:
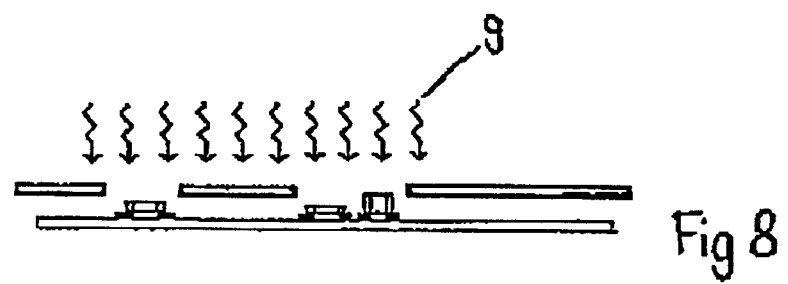
FIG. 8 shows a heating-gas supply with an encompassing extent.
Figure 9:
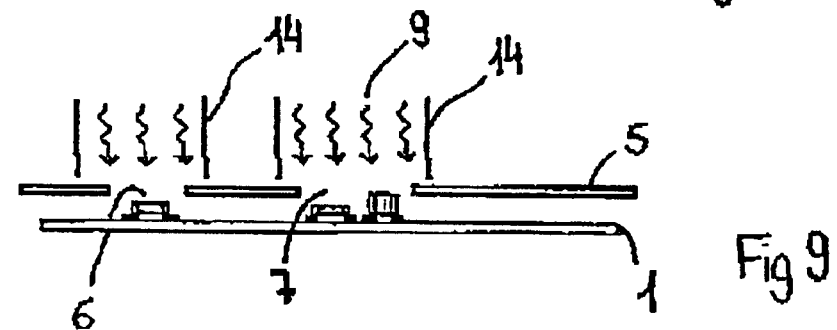
FIG. 9 shows a heating-gas supply concentrated through nozzles.

FIGS. 8 and 9 compare the way in which the heating-gas steam 9 is applied to the plastic sheet; in accordance with FIG. 8, the supply is encompassing (cf. FIGS. 2 and 3), and in FIG. 9 the heating-gas stream is supplied via diagrammatically illustrated nozzles 14 which, in addition to the windows 6 and 7 in the template 5, bring about particular concentration of the heating-gas stream 9 and therefore suppress heating of the plastic sheet 1 in the region outside the electrical components.

FIG. 10 shows an exemplary embodiment of items which are to be soldered, in the form of a flexible printed circuit board which comprises the relatively large sheet areas 15, 16 and 11 and the line sections 18 and 19 which connect them, the latter forming narrow strips of the plastic sheet to which electrical conductor tracks have been applied. Flexible printed circuit boards of this type can be laid within tight spaces, for example in the body of an automobile, in which the connections in many cases have to be curved tightly at a plurality of locations and have to be fitted into the body shape accordingly. This is particularly simple when flexible printed circuit boards are used and is advantageous compared to normal wiring arrangements because wiring arrangements laid in this manner are always exposed to considerable bending loads and therefore may break.

FIGS. 11a, b, c illustrate various soldering materials which have been applied to the plastic sheet 1 and can be soldered using the process described above. FIG. 11a shows printed-on soldering paste, FIG. 11b shows primary reflow application of solder, and FIG. 11c shows solder preform which has been adhesively bonded onto the sheet.

FIG. 12 shows the temperature curve when employing the process described above on the time axis t. In accordance with this figure, first of all the items to be soldered are preheated in section 19, whereupon, when the preheating temperature has been reached, this temperature in held over section 20, during which the soldering material is activated, whereupon by means of the heating-gas stream the temperature of the soldering locations is briefly increased to the temperature peak 21 the soldering. Then, the heat supplied is rapidly reduced over section 22, which may also involve a cooled gas stream which as can be seen, rapidly reduces the temperature of the items being soldered, and this temperature ultimately drops to room temperature over section 23. It can be seen from the diagram illustrated in FIG. 12 that the temperature required for soldering is effected by means of a short blast of heat up to the temperature peak 21, so that, therefore, the temperature load on the items being soldered and therefore in particular the plastic sheet is limited to a minimum.

What is claimed is:

1. Process for soldering electrical components (2,3) provided with soldering material to soldering positions on a plastic sheet (1) provided with applied conductor tracks, characterized by heating a plastic sheet (1) from a side which is remote from the components (2,3) to a temperature below its damage temperature, thermally insulating the side which is remote from the components (2,3) after said heating, and heating a side of the plastic sheet (1) which faces the components by a heating-gas stream (9) which is concentrated onto the locations which are to be soldered by a template (5) which has windows (6,7).

2. Process according to claim 1, characterized in that the heating of the plastic sheet (1) and the application of heat to that side of the plastic sheet (1) which faces the components (2, 3) takes place substantially simultaneously.

3. Process according to claim 1, characterized in that, with the plastic sheet (1) held securely, the temperature of the heating-gas stream (9) is regulated in such a manner that initially the soldering locations are preheated for a time which activates the soldering material, whereupon the temperature of the heating-gas stream (9) is briefly increased, until the solder contained in the soldering material melts, and is then rapidly reduced.

4. Process according to claim 3, characterized in that the heating-gas stream (9) is switched off after the melting.

5. Process according to claim 3, characterized in that the heating-gas stream (9) is converted into a cooling stream.

* * * * *